(12) United States Patent
Sato et al.

(10) Patent No.: US 9,373,634 B2
(45) Date of Patent: Jun. 21, 2016

(54) METHOD FOR MANUFACTURING SEMICONDUCTOR DEVICE AND SEMICONDUCTOR DEVICE (71) Applicant: Kabushiki Kaisha Toshiba, Minato-ku (JP)

(72) Inventors: Mitsuru Sato, Mie-ken (JP); Masaru Kito, Mie-ken (JP); Megumi Ishiduki, Mie-ken (JP); Ryota Katsumata, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/707,774

(22) Filed: May 8, 2015

(65) Prior Publication Data

US 2015/0249094 A1    Sep. 3, 2015

Related U.S. Application Data

(63) Continuation of application No. 13/930,401, filed on Jun. 28, 2013, now Pat. No. 9,054,132.

(30) Foreign Application Priority Data

Jul. 2, 2012   (JP) ................ 2012-148617

(51) Int. Cl.
*H01L 29/792*   (2006.01)
*H01L 27/115*   (2006.01)
*H01L 29/66*   (2006.01)
*H01L 29/78*   (2006.01)
*H01L 29/423*   (2006.01)
*H01L 29/06*   (2006.01)

(52) U.S. Cl.
CPC ...... *H01L 27/11582* (2013.01); *H01L 27/1157* (2013.01); *H01L 29/42344* (2013.01); *H01L 29/66666* (2013.01); *H01L 29/66833* (2013.01); *H01L 29/7827* (2013.01); *H01L 29/792* (2013.01); *H01L 29/7926* (2013.01); *H01L 29/0657* (2013.01)

(58) Field of Classification Search
None
See application file for complete search history.

(56) References Cited

U.S. PATENT DOCUMENTS

| | | |
|---|---|---|
| 8,350,326 B2 | 1/2013 | Fukuzumi et al. |
| 8,372,720 B2 | 2/2013 | Fukuzumi et al. |
| 8,410,538 B2 | 4/2013 | Ishiduki et al. |
| 2010/0207195 A1 | 8/2010 | Fukuzumi et al. |
| 2010/0224929 A1 | 9/2010 | Jeong et al. |
| 2010/0244119 A1 | 9/2010 | Fukuzumi et al. |
| 2011/0227140 A1 | 9/2011 | Ishiduki et al. |

(Continued)

FOREIGN PATENT DOCUMENTS

| | | |
|---|---|---|
| JP | 2009-146954 A | 7/2009 |
| JP | 2011-198806 A | 10/2011 |

(Continued)

*Primary Examiner* — Sonya D McCall Shepard
(74) *Attorney, Agent, or Firm* — Oblon, McClelland, Maier & Neustadt, L.L.P.

(57) ABSTRACT

According to one embodiment, a method is disclosed for manufacturing a semiconductor device. The second insulating film seals the hole near an interface of the insulating layer and the select gate. The second insulating film is provided on a side wall of the channel body with a space left in the hole above the select gate. The method can include burying a semiconductor film in the space, in addition, forming a conductive film in contact with the channel body.

21 Claims, 9 Drawing Sheets

(56) References Cited

U.S. PATENT DOCUMENTS

| | | |
|---|---|---|
| 2011/0233644 A1 | 9/2011 | Fukuzumi et al. |
| 2011/0233648 A1 | 9/2011 | Seol et al. |
| 2012/0235221 A1 | 9/2012 | Ishiduki et al. |
| 2013/0075805 A1 | 3/2013 | Sato et al. |
| 2013/0126961 A1 | 5/2013 | Fukuzumi et al. |

FOREIGN PATENT DOCUMENTS

| | | |
|---|---|---|
| JP | 2011-198963 A | 10/2011 |
| JP | 2011-204713 A | 10/2011 |
| JP | 2013-69831 A | 4/2013 |
| WO | WO 2009/075370 A1 | 6/2009 |

METHOD FOR MANUFACTURING SEMICONDUCTOR DEVICE AND SEMICONDUCTOR DEVICE

CROSS-REFERENCE TO RELATED APPLICATION

This application is a continuation of U.S. application Ser. No. 13/930,401, filed Jun. 28, 2013 and is based upon and claims the benefit of priority from Japanese Patent Application No. 2012-148617, filed on Jul. 2, 2012; the entire contents of each of which are incorporated herein by reference.

FIELD

Embodiments described herein relate generally to a method for manufacturing a semiconductor device and a semiconductor device.

BACKGROUND

A memory device of a three-dimensional structure is proposed in which a memory hole is formed in a stacked body in which a conductive layer functioning as the control gate of a memory cell and an insulating layer are alternately stacked in plural, and a silicon body serving as a channel is provided on the side wall of the memory hole via a charge storage film.

In such a three-dimensionally stacked memory, the electric potential of the channel body is controlled by the control of a vertical transistor provided above the memory cell.

BRIEF DESCRIPTION OF THE DRAWINGS

FIG. 5A to FIG. 11C are schematic cross-sectional views showing a method for manufacturing the semiconductor device according to the embodiment.

DETAILED DESCRIPTION

According to one embodiment, a method is disclosed for manufacturing a semiconductor device. The method can include forming a stacked body on a substrate. The stacked body includes a select gate and an insulating layer provided on the select gate. The method can include forming a hole piercing the stacked body, forming a first insulating film on a side wall of the hole, and forming a channel body on a side wall of the first insulating film, and forming a second insulating film. The second insulating film seals the hole near an interface of the insulating layer and the select gate. The second insulating film is provided on a side wall of the channel body with a space left in the hole above the select gate and has a film thickness in a side wall portion surrounding the space thinner than a film thickness in a bottom portion sealing the hole. The method can include burying a semiconductor film in the space. In addition, the method can include forming a conductive film in contact with the channel body on an inside of the channel body in the hole on the semiconductor film.

Various embodiments will be described hereinafter with reference to the accompanying drawings.

In the drawings, identical components are marked with the same reference numerals.

Figure 1:
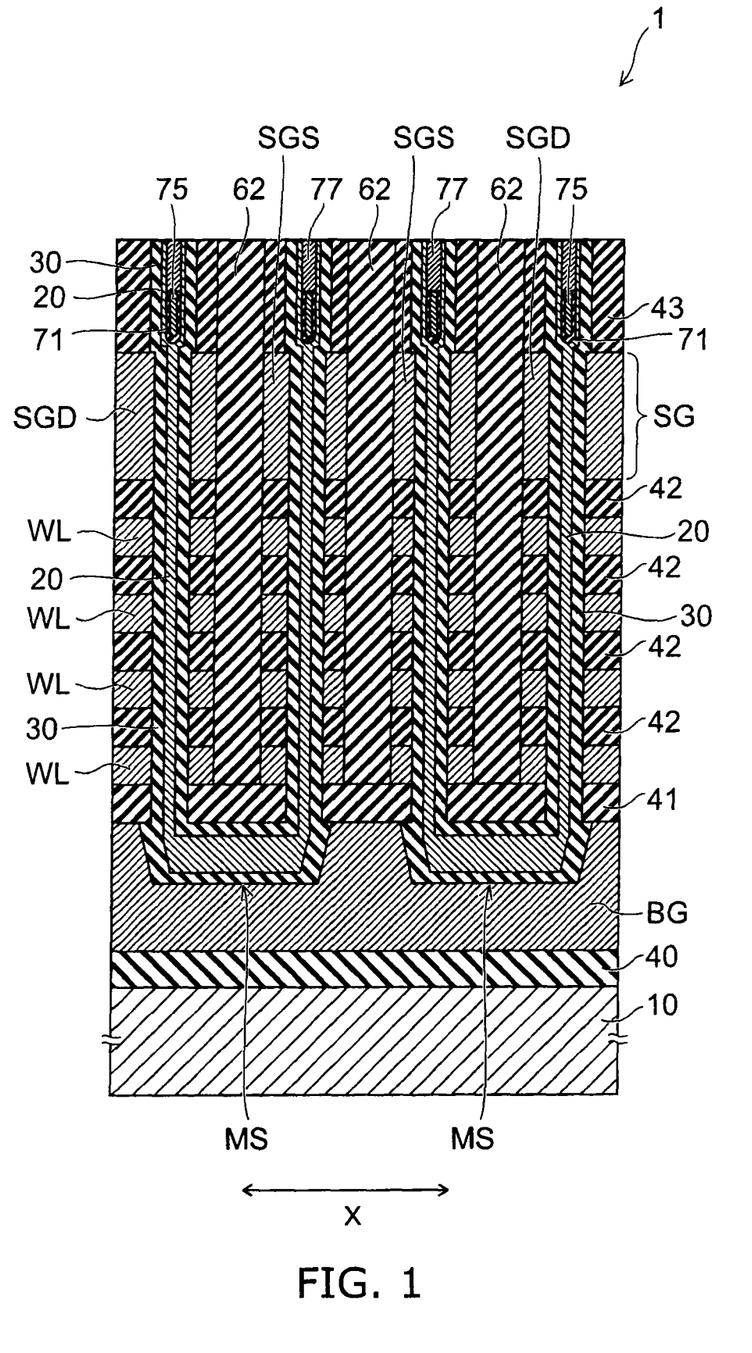
FIG. 1 is a schematic cross-sectional view of a semiconductor device according to an embodiment.
Figure 2:
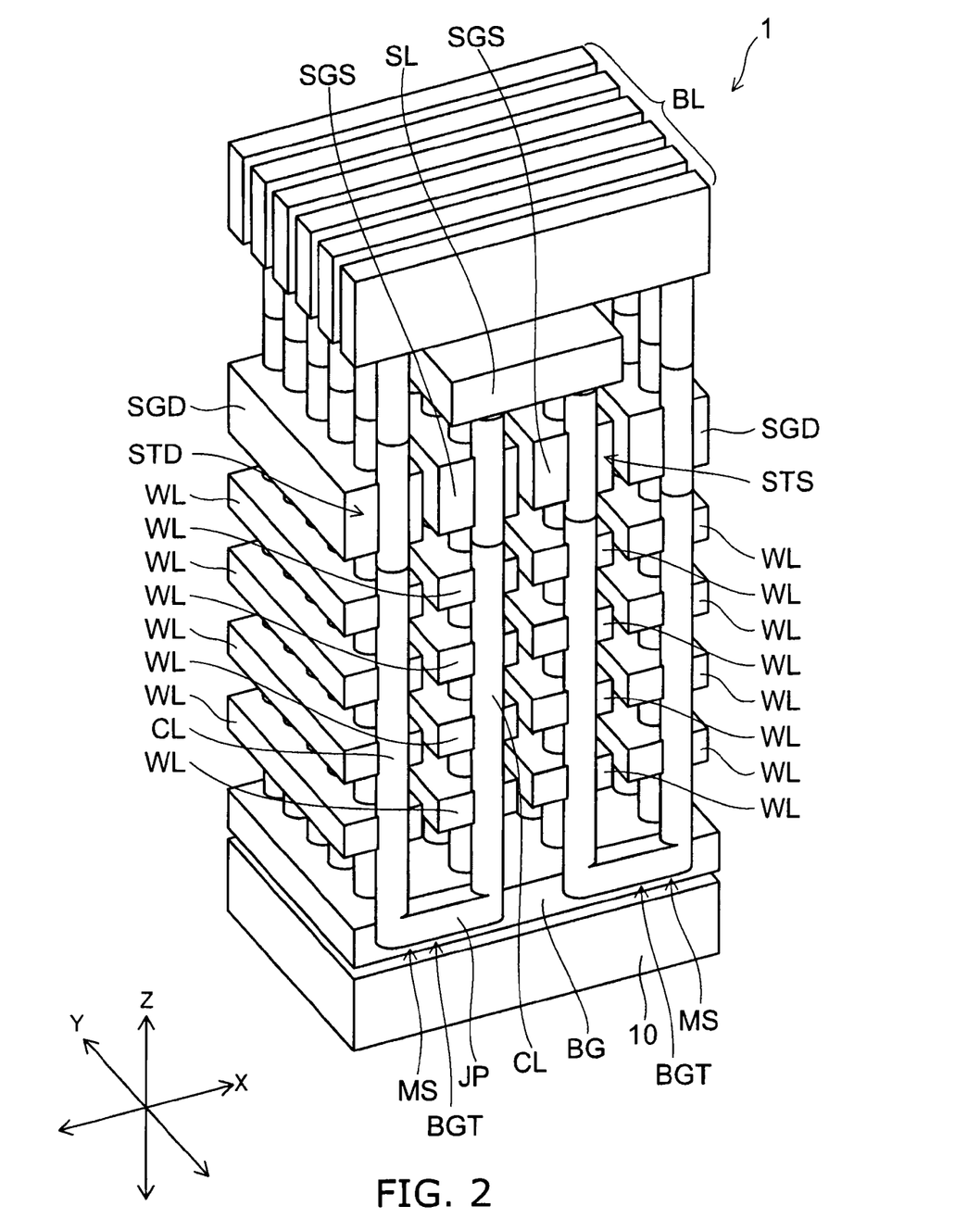
FIG. 2 is a schematic perspective view of the semiconductor device according to the embodiment.

FIG. 1 is a schematic cross-sectional view of a memory cell array 1 in a semiconductor device of an embodiment, and FIG. 2 is a schematic perspective view of the memory cell array 1. In FIG. 2, the illustration of the insulating portions is omitted for easier viewing of the drawing.

In FIG. 2, an XYZ orthogonal coordinate system is introduced. Two directions parallel to the major surface of a substrate 10 and orthogonal to each other are defined as the X direction (a first direction) and the Y direction (a second direction), and the direction orthogonal to both of the X direction and the Y direction is defined as the Z direction (a third direction or the stacking direction). FIG. 1 shows a cross section parallel to the XZ plane in FIG. 2.

The memory cell array 1 includes a plurality of memory strings MS. One memory string MS is formed in a U-shaped configuration including a pair of columnar portions CL extending in the Z direction and a joining portion JP joining the lower ends of the pair of columnar portions CL.

Figure 3:
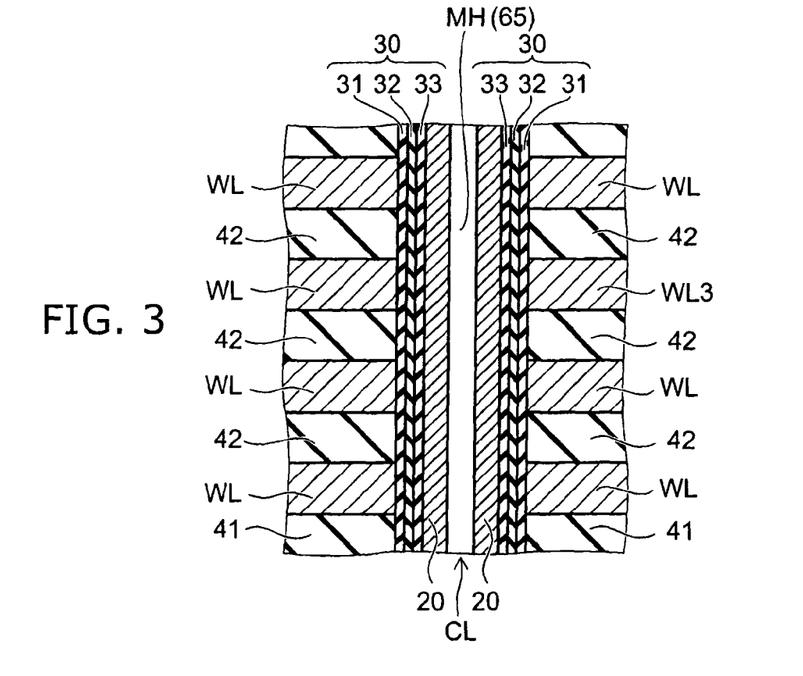
FIG. 3 is a schematic enlarged cross-sectional view of a part of the semiconductor device according to the embodiment.

FIG. 3 shows an enlarged cross-sectional view of the columnar portion CL in the memory string MS.

As shown in FIG. 1, a back gate BG is provided on the substrate 10 via an insulating layer 40. The back gate BG is a conductive film, and is, for example, a silicon film doped with an impurity.

An insulating layer 41 is provided on the back gate BG. A conductive layer WL and an insulating layer 42 are alternately stacked in plural on the insulating layer 41. Although four conductive layers WL, for example, are illustrated in FIGS. 1 and 2, the number of conductive layers is arbitrary.

The conductive layer WL is a polysilicon film doped with, for example, boron as an impurity, and has an electrical conductivity sufficient to function as the gate electrode of a memory cell.

The insulating layers 40 to 42 are, for example, a film mainly containing silicon oxide. Alternatively, a film mainly containing silicon nitride may be used as the insulating layers 40 to 42.

A drain-side select gate SGD is provided in the upper end portion of one of the pair of columnar portions CL of the U-shaped memory string MS, and a source-side select gate SGS is provided in the upper end portion of the other of the pair of columnar portions CL. The drain-side select gate SGD and the source-side select gate SGS are provided on the uppermost conductive layer WL via the insulating layer 42.

In the following description, the drain-side select gate SGD and the source-side select gate SGS may not be distinguished, and may be collectively referred to as simply a select gate SG.

The drain-side select gate SGD and the source-side select gate SGS are a polysilicon film doped with, for example, boron as an impurity similarly to the conductive layer WL, and have an electrical conductivity sufficient to function as the gate electrode of a select transistor. The thickness of the drain-side select gate SGD and the thickness of the source-side select gate SGS are thicker than the thickness of each of the conductive layers WL.

The drain-side select gate SGD and the source-side select gate SGS are divided in the X direction by an insulating film 62 shown in FIG. 1. Also the conductive layer WL stacked under the drain-side select gate SGD and the conductive layer WL stacked under the source-side select gate SGS are divided in the X direction by the insulating film 62. The insulating film 62 is provided also between the memory strings MS adjacent in the X direction.

A source line SL shown in FIG. 2 is provided on the source-side select gate SGS via an insulating layer 43 shown in FIG. 1. The source line SL is, for example, a metal film. Bit lines BL that are a plurality of metal interconnections are provided on the drain-side select gate SGD and the source line SL via the insulating layer 43. Each bit line BL extends in the X direction.

The memory string MS includes a channel body 20 provided in a U-shaped memory hole formed in the stacked body including the back gate BG, the plurality of conductive layers WL, the insulating layers 41 to 43, the drain-side select gate SGD, and the source-side select gate SGS.

The channel body 20 is provided in the U-shaped memory hole via a memory film 30. The channel body 20 is, for example, a non-doped silicon film. Here, "non-doped" means that an impurity for providing electrical conductivity is not intentionally added to the silicon film and impurities are not substantially contained other than the elements resulting from the source gas in the film-formation.

As shown in FIG. 3, the memory film 30 is provided between the side wall of the memory hole MH and the channel body 20. A hollow portion is left on the central axis side of the memory hole MH, and the channel body 20 surrounds the hollow portion in a tubular configuration. Alternatively, the entire space in the memory hole MH may be filled up with the channel body 20, or a structure in which an insulator is buried in the hollow portion on the inside of the channel body 20 is possible.

The memory film 30 includes a block film 31, a charge storage film 32, and a tunnel film 33. The block film 31, the charge storage film 32, and the tunnel film 33 are provided in this order from the conductive layer WL side between each conductive layer WL and the channel body 20. The block film 31 is in contact with each conductive layer WL, the tunnel film 33 is in contact with the channel body 20, and the charge storage film 32 is provided between the block film 31 and the tunnel film 33.

The channel body 20 functions as a channel in a memory cell, the conductive layer WL functions as the control gate of the memory cell, and the charge storage film 32 functions as a data memory layer that stores a charge injected from the channel body 20. That is, a memory cell with a structure in which the control gate surrounds the periphery of the channel is formed at the intersection between the channel body 20 and each conductive layer WL.

The semiconductor device of the embodiment is a nonvolatile semiconductor memory device that can perform the erasing and writing of data electrically in a free manner and can retain the memory content even when the power is turned off.

The memory cell is, for example, a charge trap memory cell. The charge storage film 32 includes a large number of trap sites that trap a charge, and is a silicon nitride film, for example.

The tunnel film 33 is, for example, a silicon oxide film, and forms a potential barrier when a charge is injected from the channel body 20 into the charge storage film 32 or when the charge stored in the charge storage film 32 is diffused to the channel body 20.

The block film 31 is, for example, a silicon oxide film, and prevents the charge stored in the charge storage film 32 from diffusing to the conductive layer WL.

The drain-side select gate SGD, the channel body 20, and the memory film 30 between them constitute a drain-side select transistor STD (shown in FIG. 2). Above the drain-side select gate SGD, the channel body 20 is electrically connected to the bit line BL.

The source-side select gate SGS, the channel body 20, and the memory film 30 between them constitute a source-side select transistor STS (shown in FIG. 2). Above the source-side select gate SGS, the channel body 20 is electrically connected to the source line SL.

In the following description, the drain-side select transistor STD and the source-side select transistor STS may not be distinguished, and may be collectively referred to as simply a select transistor ST.

The back gate BG, and the channel body 20 and the memory film 30 provided in the back gate BG constitute a back gate transistor BGT (shown in FIG. 2).

The memory cell using each conductive layer WL as the control gate is provided in plural between the drain-side select transistor STD and the back gate transistor BGT. Similarly, the memory cell using each conductive layer WL as the control gate is provided in plural also between the back gate transistor BGT and the source-side select transistor STS.

The plurality of memory cells, the drain-side select transistor STD, the back gate transistor BGT, and the source-side select transistor STS are connected in series via the channel body 20, and constitute one U-shaped memory string MS. The memory string MS is arranged in plural in the X direction and the Y direction; thus, a plurality of memory cells MC are provided three-dimensionally in the X direction, the Y direction, and the Z direction.

Figure 4:
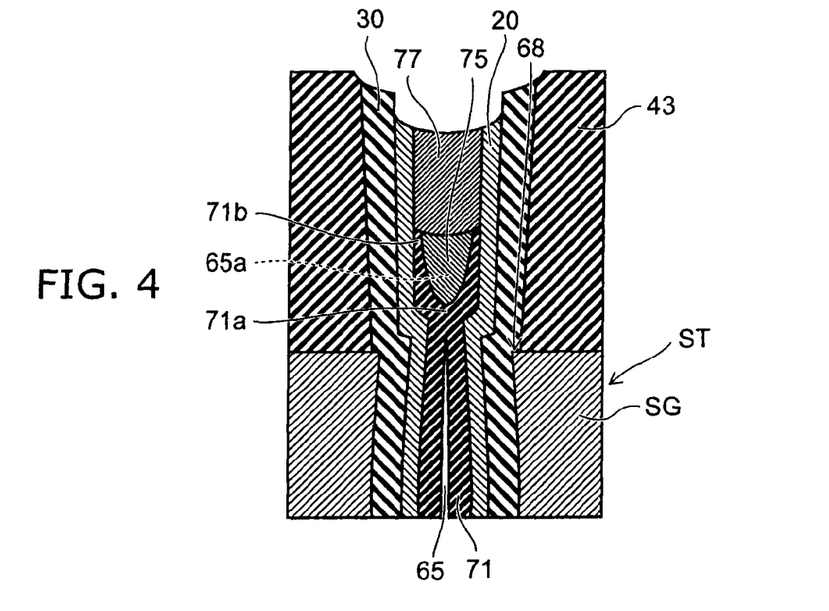
FIG. 4 is a schematic enlarged cross-sectional view of a part of the semiconductor device according to the embodiment.

FIG. 4 is an enlarged schematic cross-sectional view of the stacked body including the select gate SG and the insulating layer 43 thereon.

As described later, a hole 65 piercing the stacked body described above is formed in the stacked body. After the hole 65 is formed, the hole diameter of a portion surrounded by the insulating layer 43 of the hole 65 is expanded as described later. Thereby, a level difference 68 is formed between the upper end of the select gate SG and the side wall of the insulating layer 43.

On the side wall of the hole 65, the memory film 30 is provided as a first insulating film. The memory film 30 between select gates SG functions as the gate insulating film of the select transistor ST. The channel body 20 is provided on the side wall of the memory film 30.

On the side wall of the channel body 20, a core insulating film 71 is provided as a second insulating film. The core insulating film 71 is, for example, a silicon oxide film. The core insulating film 71 seals the hole 65 near the end portion (in the drawing, the upper end portion) on the insulating layer 43 side of the select gate SG. That is, the core insulating film 71 has a bottom portion 71a that seals the hole 65 near the end portion on the insulating layer 43 side of the select gate SG.

A semiconductor film 75 is provided on the inside of the core insulating film 71 in the hole 65 on the bottom portion 71a. The semiconductor film 75 is a non-doped silicon film to which an impurity for providing electrical conductivity is not intentionally added and which does not substantially contain impurities other than the elements resulting from the source gas in the film-formation.

The semiconductor film 75 is provided on the inside of a side wall portion 71b of the core insulating film 71 in the hole 65 above the select gate SG. The side wall portion 71b of the core insulating film 71 is provided in contact with the side wall of the channel body 20 above the bottom portion 71a sealing the hole 65, and surrounds the periphery of the semiconductor film 75. In the core insulating film 71, the film thickness of the side wall portion 71b is thinner than the film thickness of the bottom portion 71a.

A conductive film 77 is provided on the semiconductor film 75 and on the upper end of the side wall portion 71b of the core insulating film 71. The conductive film 77 is provided on the inside of the channel body 20 in the hole 65 on the semiconductor film 75, and is in contact with the side wall of the channel body 20. The conductive film 77 is a silicon film doped with, for example, phosphorus (P) as an impurity.

A portion of the channel body 20 in contact with the conductive film 77 is implanted with an impurity to be provided with electrical conductivity, as described later. On the conductive film 77, an interconnection WR (the bit line BL or the source line SL) is provided as shown in FIG. 11C, and the channel body 20 is connected to the interconnection WR via the conductive film 77.

In the semiconductor device of the embodiment, the data erase operation is an operation that extracts electrons from the charge storage film 32 or injects holes into the charge storage film 32. The transistor forming a memory cell using the conductive layer WL as the control gate has a state where the threshold voltage is relatively low (the erase state) and a state where the threshold voltage is relatively high (the write state). The erase operation is an operation that sets the threshold voltage of the memory cell to the state on the lower side.

In a memory of a common two-dimensional structure, electrons written in the floating gate are extracted by raising the substrate potential. However, in a semiconductor device of a three-dimensional structure like the embodiment, the channel of the memory cell is not directly connected to the substrate. Hence, a method is proposed in which a GIDL (gate induced drain leakage) current generated in the channel at an end of the select gate is utilized to boost the channel potential of the memory cell.

That is, the channel body 20 near the upper end portion of the select gate SG (near the level difference 68) is doped with an impurity at a high concentration as described later, and a high voltage is applied to the impurity diffusion region to generate a high electric field in a depletion layer formed between the select gate SG and the impurity diffusion region. Thereby, inter-band tunneling is brought about, and generated holes are supplied into the channel body 20; thus, the channel potential is raised. By setting the electric potential of the conductive layer WL to, for example, the ground potential (0 V), due to the potential difference between the channel body 20 and the conductive layer WL, electrons of the charge storage film 32 are extracted, or holes are injected into the charge storage film 32. Thus, the erase operation is performed.

Next, a method for manufacturing a semiconductor device of the embodiment is described with reference to FIG. 5A to FIG. 11C.

Figure 5A:
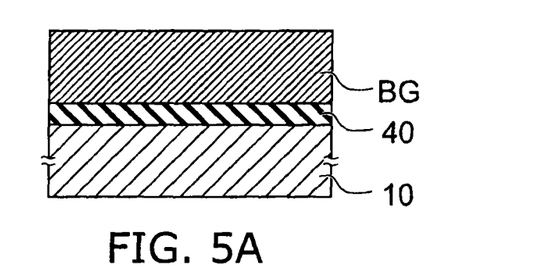
Figure 5B:
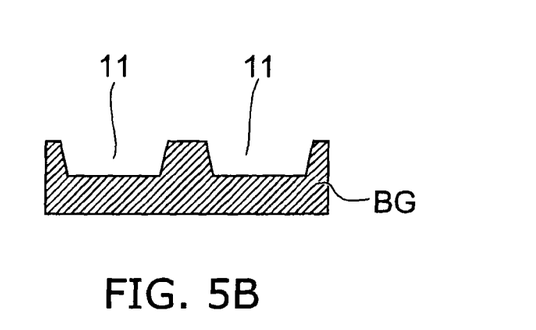

As shown in FIG. 5A, the back gate BG is formed on the substrate 10 via the insulating layer (e.g. silicon oxide) 40. The back gate BG is a polysilicon film doped with boron (B). In FIG. 5B and the subsequent drawings, the illustration of the substrate 10 and the insulating layer 40 is omitted.

In the back gate BG, a plurality of trenches 11 are formed as shown in FIG. 5B by etching using a not-shown mask.

Figure 5C:
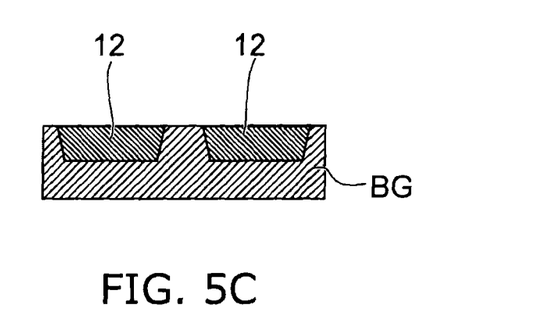

As shown in FIG. 5C, a sacrifice film 12 is buried in the trench 11. The sacrifice film 12 is a non-doped silicon film.

Figure 6A:
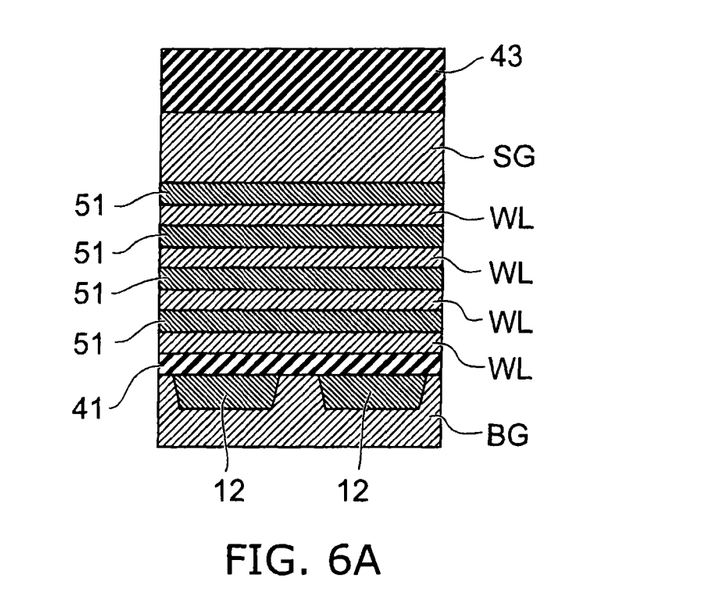

The upper surface of the protruding portion of the back gate BG between a trench 11 and a trench 11 is exposed. The upper surface of the protruding portion of the back gate BG and the upper surface of the sacrifice film 12 are flat surfaces flush with each other. As shown in FIG. 6A, the insulating layer 41 is formed on the flat surface. The insulating layer 41 has a film thickness sufficient to ensure the breakdown voltage between the back gate BG and the lowermost conductive layer WL.

The conductive layer WL and a non-doped silicon film 51 are alternately stacked in plural on the insulating layer 41. The conductive layer WL is a polysilicon film doped with, for example, boron (B) as an impurity. The non-doped silicon film 51 is a silicon film to which an impurity for providing electrical conductivity is not intentionally added, and does not substantially contain impurities other than the elements resulting from the source gas in the film-formation.

The non-doped silicon film 51 is finally replaced with the insulating layer 42 shown in FIG. 1 in a process described later. The non-doped silicon film 51 has a film thickness sufficient to ensure the breakdown voltage between conductive layers WL.

The select gate SG that forms the drain-side select gate SGD or the source-side select gate SGS is formed on the uppermost non-doped silicon film 51, and the insulating layer 43 is formed on the select gate SG. The select gate SG is a polysilicon film doped with, for example, boron (B) as an impurity.

The back gate BG and the stacked body mentioned above on the back gate BG are formed by, for example, the CVD (chemical vapor deposition) method.

Figure 6B:
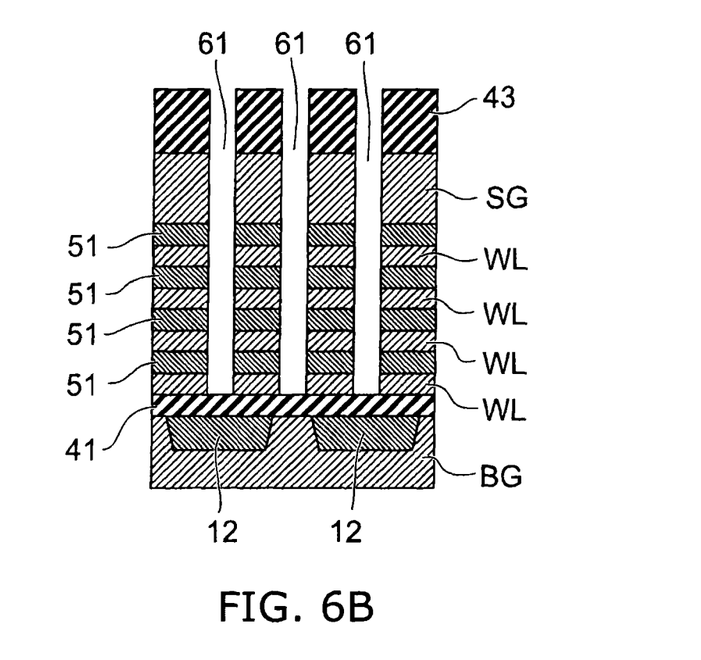

After the stacked body shown in FIG. 6A is formed, photolithography and etching are performed to form a plurality of trenches 61 that divide the stacked body and reach the insulating layer 41 as shown in FIG. 6B. The trench 61 divides the stacked body mentioned above in the X direction in FIG. 1, on the sacrifice film 12 and between adjacent sacrifice films 12.

Figure 7A:
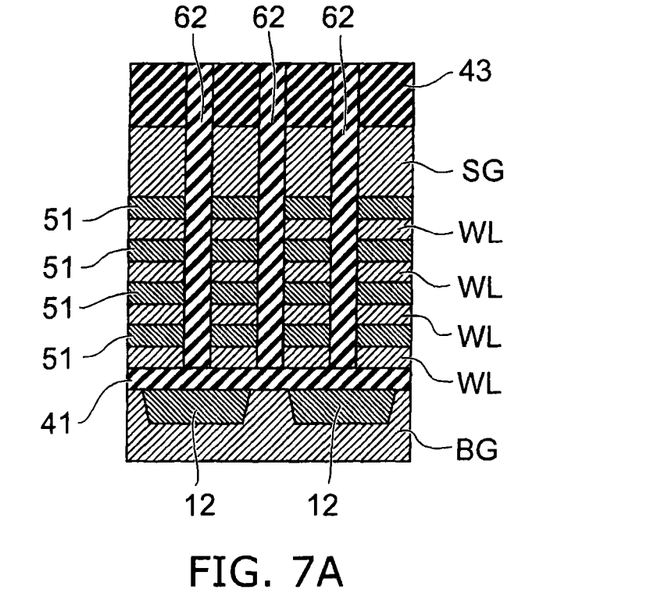

As shown in FIG. 7A, the insulating film 62 is buried in the trench 61. The insulating film 62 is, for example, a silicon oxide film or a silicon nitride film.

Although the insulating film 62 is deposited also on the insulating layer 43, the insulating film 62 on the insulating layer 43 is removed and the insulating layer 43 is exposed. The upper surface of the insulating layer 43 and the upper surface of the insulating film 62 are made flat in a flush manner.

After the insulating film 62 is formed, a plurality of holes 65 are formed in the stacked body mentioned above as shown in FIG. 7B. The hole 65 is formed by, for example, the RIE (reactive ion etching) method using a not-shown mask.

Figure 7B:
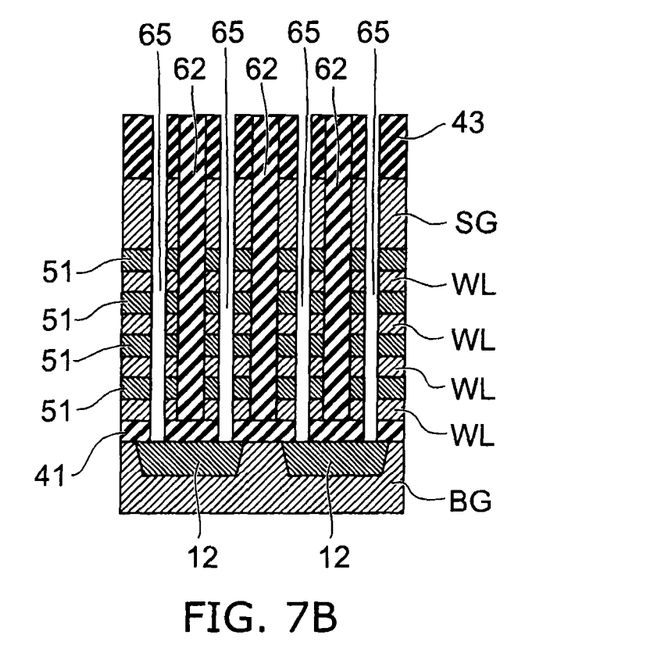

Since all the components of the stacked body between the insulating layer 41 and the insulating layer 43 are silicon films, the setting of the conditions of RIE and the shape controllability of the hole 65 are easy.

The bottom of the hole 65 reaches the sacrifice film 12, and the sacrifice film 12 is exposed at the bottom of the hole 65. A pair of holes 65 are formed on one sacrifice film 12, with the insulating film 62 located between the holes 65. The conductive layer WL and the non-doped silicon film 51 are exposed at the side wall of the hole 65.

Figure 8A:
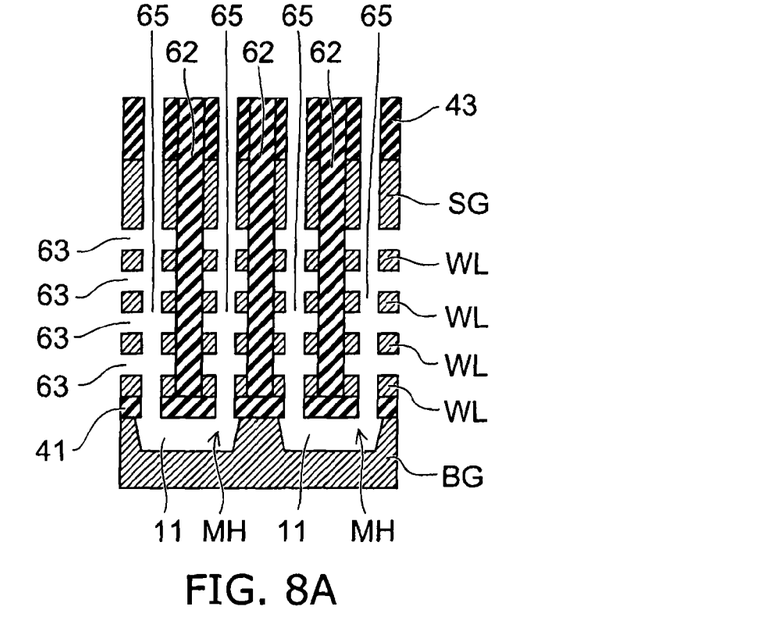

After the hole 65 is formed, the sacrifice film 12 and the non-doped silicon film 51 are removed by, for example, wet etching. As the etchant at this time, for example, an alkaline chemical liquid such as a KOH (potassium hydroxide) solution is used. FIG. 8A shows the state after the wet etching.

The etching rate of the silicon film to the alkaline chemical liquid depends on the concentration of boron doped in the silicon film. In particular, when the boron concentration becomes $1 \times 10^{20}$ (cm$^{-3}$) or more, the etching rate decreases rapidly to become a few percent of that when the boron concentration is $1 \times 10^{19}$ (cm$^{-3}$) or less.

In the embodiment, the boron concentration of the back gate BG, the conductive layer WL, and the select gate SG is $1 \times 10^{21}$ (cm$^{-3}$) to $2 \times 10^{21}$ (cm$^{-3}$). In the wet etching using an alkaline chemical liquid, the etching selection ratio of the silicon film with a boron concentration of $1\times10^{21}$ (cm$^{-3}$) to $2\times10^{21}$ (cm$^{-3}$) to the non-doped silicon film is $\frac{1}{1000}$ to $\frac{1}{100}$.

Therefore, by the wet etching mentioned above, the non-doped silicon film 51 and the sacrifice film 12, which is likewise a non-doped silicon film, are removed via the hole 65. On the other hand, the back gate BG, the conductive layer WL, and the select gate SG are left.

By the removal of the sacrifice film 12, the trench 11 appears which has been formed in the back gate BG in the previous process. The bottoms of a pair of holes 65 are connected to one common trench 11 to form one U-shaped memory hole MH.

By the removal of the non-doped silicon film 51, a space 63 is formed between conductive layers WL. The space 63 leads to the memory hole MH.

The conductive layers WL and the select gate SG are supported by the insulating film 62, and the state where the conductive layers WL and the select gate SG are stacked via the space 63 is maintained.

After the wet etching mentioned above, as shown in FIG. 8B, the memory film 30 is formed on the side wall of the memory hole MH, and the insulating layer 42 is formed in the space 63.

Figure 8B:
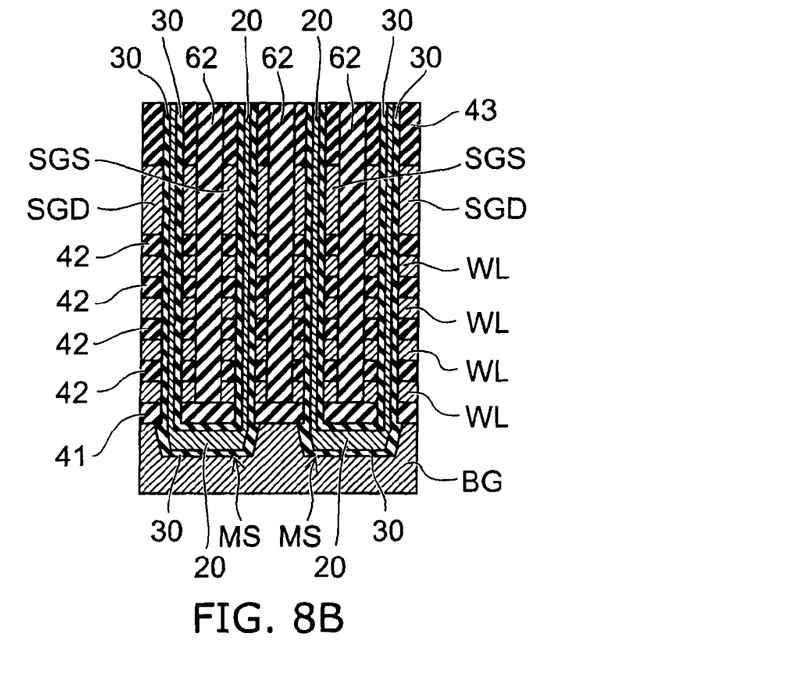

As described above with reference to FIG. 3, the memory film 30 includes the block film 31, the charge storage film 32, and the tunnel film 33 stacked in this order from the side of the side wall of the memory hole MH. The insulating layer 42 is formed in the space 63 simultaneously with the formation of the memory film 30 on the side wall of the memory hole MH. Thus, the insulating layer 42 includes at least the block film 31, which is part of the memory film 30.

Depending on the height of the space 63 and the film thickness of each film included in the memory film 30, the space 63 may be filled up with only the block film 31; or a stacked film including the block film 31 and the charge storage film 32 or a stacked film including the block film 31, the charge storage film 32, and the tunnel film 33 may be buried as the insulating layer 42 in the space 63.

After that, the channel body 20 is formed on the inside of the memory film 30 in the memory hole MH.

In the above description, the processes for the stacked body including the conductive layers WL in which memory cells are formed are mainly described. Next, the processes for the stacked body including the select gate SG and the insulating layer 43 thereon are described with reference to FIG. 9A to FIG. 11C.

Figure 9A:
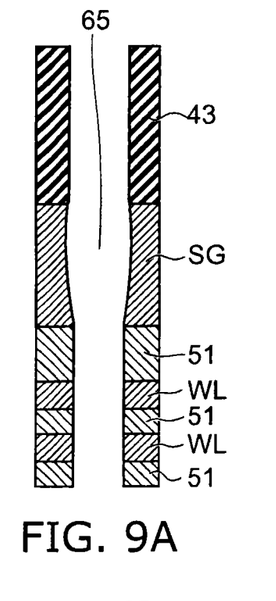

FIG. 9A shows the state shown in FIG. 7B described above after the hole 65 is formed.

The hole 65 is formed by, for example, the RIE method. The wafer on which the stacked body mentioned above is formed is held at the wafer holding unit in a processing chamber. A desired gas is introduced into the processing chamber, and electric power is applied between the wafer holding unit functioning as the lower electrode and the upper electrode opposed to the wafer holding unit to produce an electric discharge in the processing chamber.

Figure 9B:
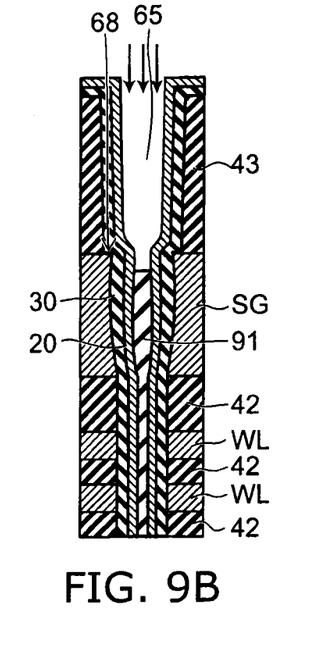

After the hole 65 is formed, hydrofluoric acid treatment (wet etching) is performed to remove the natural oxide film on the side wall of the conductive layer WL and the natural oxide film on the side wall of the select gate SG. By the hydrofluoric acid treatment, the hole diameter of the hole 65 piercing the insulating layer (silicon oxide film) 43 is expanded by approximately 5 nm, for example, and the level difference 68 is formed between the upper end of the select gate SG and the side wall of the insulating layer 43 as shown in FIG. 9B.

After the hydrofluoric acid treatment mentioned above, the memory film 30 is formed on the side wall of the hole 65, and the channel body 20 is formed on the side wall of the memory film 30. The memory film 30 and the channel body 20 are formed by, for example, the CVD method. The memory film 30 and the channel body 20 are deposited also on the upper surface of the insulating layer 43.

After that, a resist 91 is buried in the hole 65, and then the resist 91 is etched back by the RIE method. The resist 91 is recessed to a position below the upper end of the select gate SG, and a portion covering the level difference 68 of the channel body 20 is exposed. Then, the ion implantation method is performed to implant the channel body 20 with, for example, arsenic (As) as an impurity.

The portion covering the level difference 68 of the channel body 20 is formed so as to lie along the level difference 68, and protrudes to the central axis side of the hole 65. Therefore, in the channel body 20, the efficiency of implanting an impurity into the portion covering the level difference 68 is higher than the efficiency of implanting an impurity into the side wall parallel to the central axis of the hole 65. Consequently, in the channel body 20, the portion covering the level difference 68 contains the impurity at a higher concentration than the other portions. Thereby, the electric potential of the channel body 20 can be boosted by utilizing the GIDL current described above.

Figure 9C:
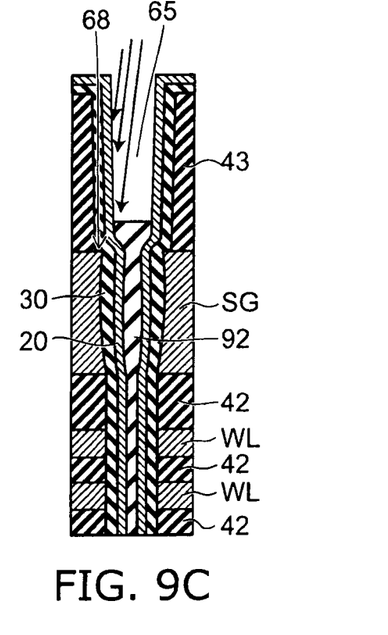

After the ion implantation mentioned above, the resist 91 is removed, then a resist 92 is buried in the hole 65 again, and the resist 92 is etched back by the RIE method to the position shown in FIG. 9C. The height of the upper surface of the resist 92 is higher than the height of the upper surface of the resist 91 in the process of FIG. 9B, and the resist 92 covers the portion where the channel body 20 covers the level difference 68.

Then, by the ion implantation method with an inclination of, for example, 5 degrees with respect to the central axis of the hole 65, the side wall above the level difference covering portion of the channel body 20 is implanted with, for example, arsenic (As) as an impurity.

After the impurity implantation into the channel body 20 mentioned above, the resist 92 is removed, and then heat treatment (annealing) is performed.

After that, a not-shown resist is buried in the hole 65 again, and the memory film 30 and the channel body 20 on the upper surface of the insulating layer 43 are removed.

Figure 10A:
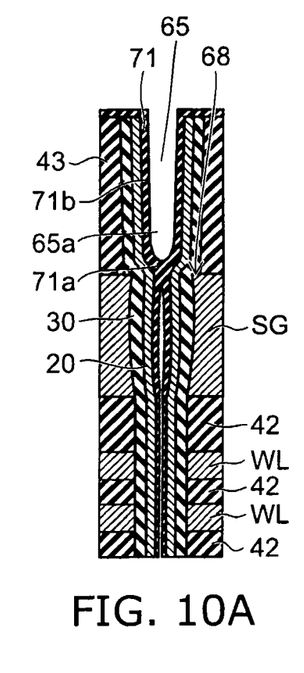

Then, the core insulating film 71 shown in FIG. 10A is formed on the side wall of the channel body 20 in the hole 65. The core insulating film 71 is a silicon oxide film formed by the plasma CVD method, in particular the HDP (high density plasma) CVD method. From the features of this film-formation method, the amount of silicon oxide film deposition in a direction along the central axis of the hole 65 (the vertical direction) is larger than the amount of silicon oxide film deposition in the diameter direction of the hole 65 (the lateral direction).

Therefore, the film thickness of the core insulating film 71 on the portion where the channel body 20 covers the level difference 68 becomes thicker than the film thickness of the core insulating film 71 formed on the side wall of the channel body 20 above the level difference covering portion.

The portion where the channel body 20 covers the level difference 68 is formed so as to protrude to the central axis side of the hole 65, and the hole diameter of the hole 65 in the level difference covering portion has become narrower than the hole diameter of the hole 65 above the level difference covering portion. Consequently, the core insulating film 71 seals the hole 65 near the level difference 68.

That is, the core insulating film 71 has the bottom portion 71a sealing the hole 65 and the side wall portion 71b formed on the side wall of the channel body 20 above the bottom portion 71a, and the film thickness of the side wall portion 71b has become thinner than the film thickness of the bottom portion 71a.

The hole 65 on the inside of the side wall portion 71b is not sealed, and a space 65a is ensured. The core insulating film 71 seals the hole 65 near the end portion on the insulating layer 43 side of the select gate SG, while leaving the space 65a on the inside of the side wall portion 71b.

The core insulating film 71 is formed also on the side wall of the channel body 20 in the hole 65 below the bottom portion 71a where the core insulating film 71 seals the hole 65. A space is left on the inside of the core insulating film 71 provided on the side wall of the channel body 20 in the hole 65 piercing the select gate SG.

Figure 10B:
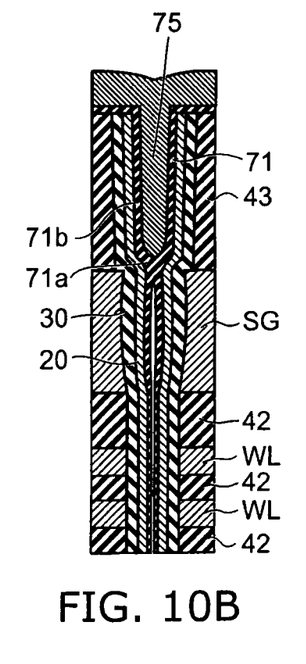

After the core insulating film 71 is formed, as shown in FIG. 10B, the semiconductor film 75 is buried by, for example, the CVD method in the space 65a located on the bottom portion 71a of the core insulating film 71 and surrounded by the side wall portion 71b. The semiconductor film 75 is a non-doped silicon film.

Since the hole 65 is sealed by the bottom portion 71a of the core insulating film 71 near the end portion on the insulating layer 43 side of the select gate SG, the semiconductor film 75 does not enter the hole 65 inside the select gate SG.

Since the film thickness of the side wall portion 71b on the bottom portion 71a of the core insulating film 71 is thinner than the film thickness of the bottom portion 71a, the burying of the semiconductor film 75 into the space 65a can be performed without obstruction. Furthermore, the non-doped silicon film is more excellent in the burying condition into a hole or a space than a silicon film doped with an impurity.

Figure 10C:
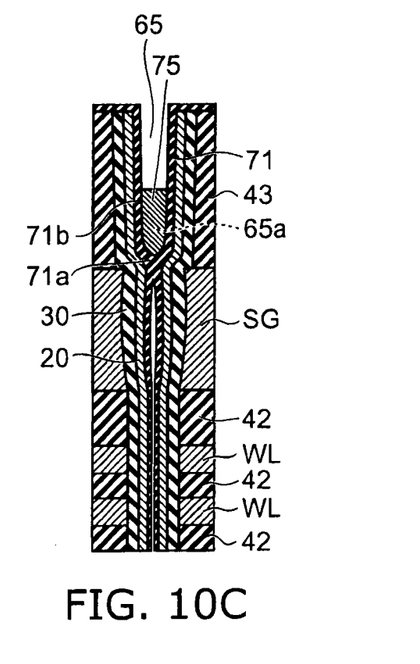

After the semiconductor film 75 is formed, the entire surface of the semiconductor film 75 is etched back by the RIE method, and the upper surface of the semiconductor film 75 is recessed to a desired height in the space 65a as shown in FIG. 10C.

The semiconductor film 75 is etched with selectivity to the core insulating film 71, which is a silicon oxide film, and the side wall portion 71b of the core insulating film 71 is exposed at the side wall of the hole 65 on the semiconductor film 75. The side wall portion 71b is removed by, for example, hydrofluoric acid treatment (wet etching). Also the core insulating film 71 deposited on the upper surface of the insulating layer 43 is removed.

Figure 11A:
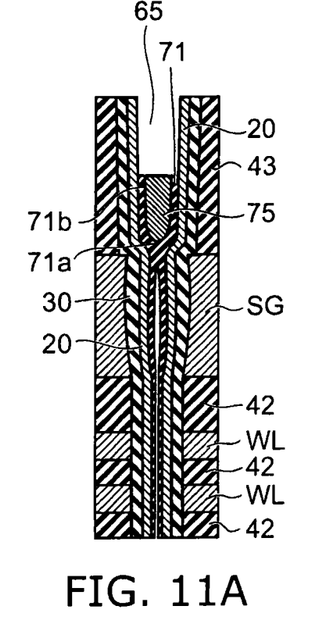

Thereby, as shown in FIG. 11A, the channel body 20 is exposed at the side wall of the hole 65 on the semiconductor film 75. The portion where the channel body 20 is exposed has been implanted with an impurity by the ion implantation described above shown in FIG. 9C.

Figure 11B:
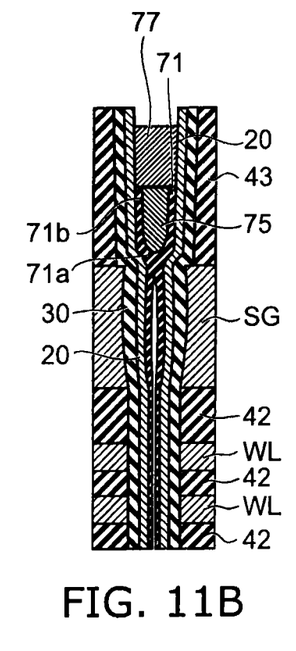
Figure 11C:
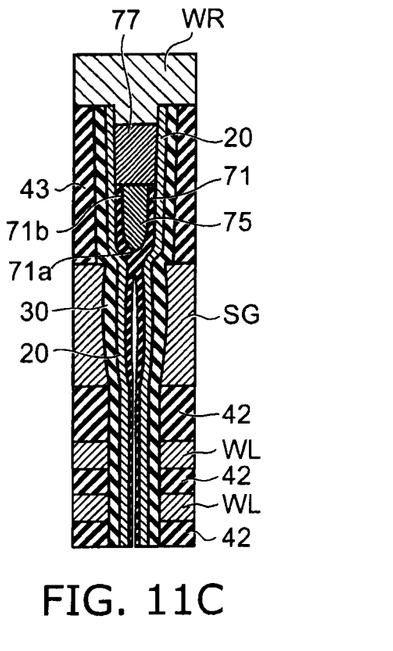

The conductive film 77 is buried in the hole 65 on the semiconductor film 75 by, for example, the CVD method. The conductive film 77 is a silicon film doped with, for example, phosphorus as an impurity. After the conductive film 77 is formed, the conductive film 77 is etched back by the RIE method, and the upper surface of the conductive film 77 is recessed to a desired height in the hole 65 as shown in FIG. 11B.

After that, the interconnection WR that forms the bit line BL or the source line SL is formed on the conductive film 77 and on the insulating layer 43 as shown in FIG. 11C. Thereby, the channel body 20 is connected to the interconnection WR via the conductive film 77.

In the embodiment described above, as shown in FIG. 11C and FIG. 4, a core material formed of the core insulating film 71 and the semiconductor film 75 is provided on the inside of the channel body 20 in the hole 65 above the select gate SG, and the conductive film 77 serving for the connection between the channel body 20 and the interconnection (the bit line BL or the source line SL) is provided on the core material. The position where the conductive film 77 is provided is determined by the core material.

When forming such a structure, if the film thickness of the core insulating film 71 is thin, there is a fear that the semiconductor film 75 will enter the hole 65 inside the select gate SG to reduce the threshold of the select transistor ST.

To prevent this, it may be possible to make the core insulating film 71 thicker, for example. However, the increase in the film thickness of the core insulating film 71 causes an increase in the aspect ratio of the space 65a in which the semiconductor film 75 will be buried, and it is feared that a reduction in the burying condition of the semiconductor film 75 will be caused.

If the burying condition of the semiconductor film 75 is not good, seams and voids are likely to be formed in the semiconductor film 75, and the existence of the seam and void worsens the controllability of the etchback of the semiconductor film 75. If the etching on the semiconductor film 75 reaches a seam or a void, the seam or void becomes larger and the conductive film 77 is likely to enter it, and this may cause a threshold variation or an unfavorable breakdown voltage of the select transistor ST.

In the embodiment, as described above, the core insulating film 71 is formed by a film-formation method in which the deposition rate of the film deposited in the vertical direction of the hole 65 is higher than the deposition rate of the film deposited in the lateral direction. Thereby, while the hole 65 is surely sealed with the bottom portion 71a having a larger film thickness than the side wall portion 71b, the increase in the film thickness of the side wall portion 71b can be suppressed to suppress the increase in the aspect ratio of the space 65a in which the semiconductor film 75 will be buried.

That is, while the core insulating film 71 is formed so as to seal the hole 65 near the upper end portion of the select gate SG, the narrowing of the width of the space 65a above the sealed portion can be suppressed and the burying condition of the semiconductor film 75 can be improved. Consequently, the conductive film 77 can be formed with good accuracy in a desired position above the select gate SG, and stable characteristics of the select transistor ST can be obtained.

As shown in FIG. 11A described above, in order to expose the side wall of the channel body 20, the upper portion of the side wall portion 71b of the core insulating film 71 is removed by hydrofluoric acid treatment (wet etching). By suppressing the increase in the film thickness of the side wall portion 71b of the core insulating film 71, the path width that allows the etchant in the hydrofluoric acid treatment to enter to the select gate SG side can be made smaller. Thereby, the situation where the hole 65 is sealed by the core insulating film 71 can be stably maintained, and the semiconductor film 75 and the conductive film 77 can be prevented from entering the hole 65 of the select transistor ST.

Figure 12A:
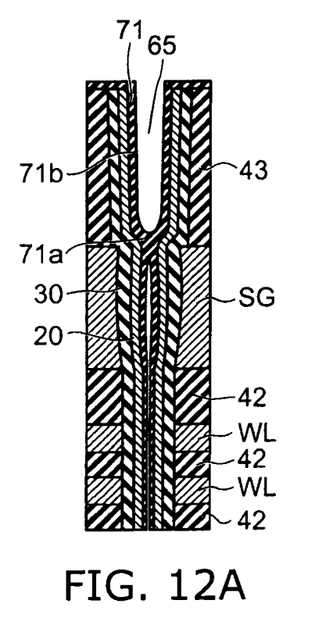
FIGS. 12A to 12C are schematic cross-sectional views showing another method for manufacturing the semiconductor device according to the embodiment.

FIG. 12A shows another method for forming the core insulating film 71.

The core insulating film 71 shown in FIG. 12A is formed by the ALD (atomic layer deposition) method in which a film thickness difference is less likely to occur between the bottom portion 71a and the side wall portion 71b than in the plasma CVD method described above.

Figure 12B:
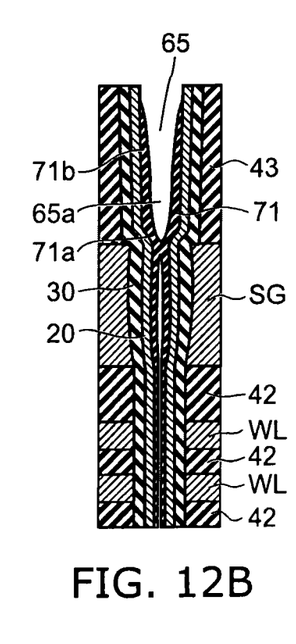

After the core insulating film 71 is formed, the entire surface of the core insulating film 71 is etched back by the RIE method, and as shown in FIG. 12B, the upper portion of the core insulating film 71 having covered the corner portion between the upper end of the insulating layer 43 and the side wall of the channel body 20 is removed while the bottom portion 71a sealing the hole 65 near the upper end portion of the select gate SG is left.

Due to the directivity of RIE, the etching progresses on the core insulating film 71 such that the corner portion on the upper side thereof is lost, and the side wall portion 71b is made a tapered shape. That is, the hole diameter of the space 65a surrounded by the side wall portion 71b is made wider on the upper opening end side than on the bottom portion 71a side. Therefore, the burying condition of the semiconductor film 75 in the space 65a is good.

Figure 12C:
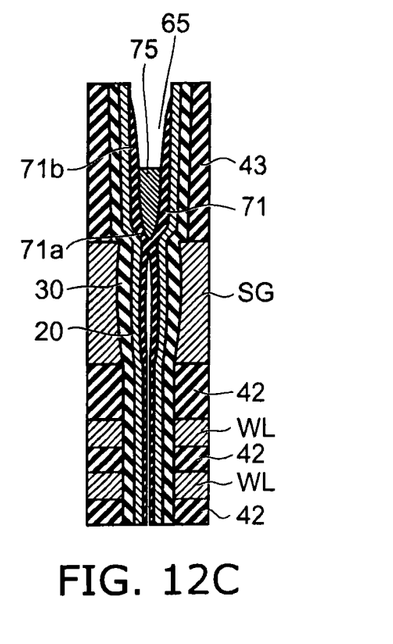

After the semiconductor film 75 is buried in the space 65a, as shown in FIG. 12C, the semiconductor film 75 is etched back to a desired position, and subsequently the processes shown in FIGS. 11A to 11C described above are performed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a plurality of control gate electrodes arranged along a first direction;
   a semiconductor material including a first portion and a second portion, the first portion extending in the first direction at least above the plurality of control gate electrodes, the second portion being provided on an inner surface of the first portion, a height of a bottom of the second portion being higher than the plurality of control gate electrodes, and a height of a top of the second portion being lower than a height of a top of the first portion; and
   a memory portion provided between the semiconductor material and one of the plurality of control gate electrodes.

2. The device according to claim 1, further comprising a bit line provided above the plurality of control gate electrodes, extending in a second direction crossing the first direction, and electrically connected to the second portion, a length between a top of a center of the second portion and the bit line being larger than a length between a top of a periphery of the second portion and the bit line, the center of the second portion being surrounded by the periphery of the second portion.

3. The device according to claim 1, wherein the second portion includes a first impurity.

4. The device according to claim 1, further comprising a select gate electrode provided above the plurality of control gate electrodes, the second portion being provided above the select gate electrode.

5. The device according to claim 4, wherein the second portion includes a first impurity, and the first portion above the select gate electrode includes a second impurity.

6. The device according to claim 5, wherein the first impurity and the second impurity are different materials.

7. A semiconductor device, comprising:
   a plurality of control gate electrodes arranged along a first direction;
   a semiconductor material including a first portion and a second portion, the first portion extending in the first direction at least above the plurality of control gate electrodes, the second portion being provided on an inner surface of the first portion, a height of a bottom of the second portion being higher than the control gate electrodes, and height of a top of the second portion being lower than a height of a top of the first portion;
   a memory portion provided between the semiconductor material and one of the plurality of control gate electrodes; and
   a bit line provided above the plurality of control gate electrodes, extending in a second direction crossing the first direction, and electrically connected to the second portion, a length between a top of a center of the second portion and the bit line being larger than a length between a top of a periphery of the second portion and the bit line, the center of the second portion being surrounded by the periphery of the second portion.

8. The device according to claim 7, wherein the second portion includes a first impurity.

9. The device according to claim 7, further comprising a select gate electrode provided above the plurality of control gate electrodes, the second portion being provided above the select gate electrode.

10. The device according to claim 9, wherein the second portion includes a first impurity, and the first portion above the select gate electrode includes a second impurity.

11. The device according to claim 10, wherein the first impurity and the second impurity are different materials.

12. The device according to claim 1, further comprising:
    a first insulating film provided on a part of an inner surface of the first portion, the first insulating film being provided under the second portion, and the first insulating film being provided on at least a part of a side surface of the second portion.

13. The device according to claim 1, wherein a height of a top of a center of the second portion is lower than a height of a top of a periphery of the second portion, the center of the second portion being surrounded by the periphery of the second portion.

14. The device according to claim 1, wherein the height of a top of the second portion at a periphery of the second portion is higher than an any inner point of the second portion.

15. The device according to claim 12, wherein the first insulating film includes a gap therein.

16. The device according to claim 7, further comprising:
    a first insulating film provided on a part of an inner surface of the first portion, the first insulating film being provided under the second portion, and the first insulating film being provided on at least a part of a side surface of the second portion.

17. The device according to claim 7, wherein a height of a top of a center of the second portion is lower than a height of a top of a periphery of the second portion, the center of the second portion being surrounded by the periphery of the second portion.

18. The device according to claim 7, wherein the height of a top of the second portion at a periphery of the second portion is higher than an any inner point of the second portion.

19. The device according to claim 16, wherein the first insulating film includes a gap therein.

20. The device according to claim 1, wherein the semiconductor material including a third portion provided under the second portion, the third portion being not intentionally doped with impurity.

21. The device according to claim 7, wherein the semiconductor material including a third portion provided under the second portion, the third portion being not intentionally doped with impurity.

* * * * *